United States Patent
Chen et al.

(10) Patent No.: US 10,063,225 B1
(45) Date of Patent: Aug. 28, 2018

(54) VOLTAGE SWITCHING DEVICE AND METHOD

(71) Applicant: NANYA TECHNOLOGY CORPORATION, New Taipei (TW)

(72) Inventors: Chih-Jen Chen, Kaohsiung (TW); Ting-Shuo Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/619,537

(22) Filed: Jun. 11, 2017

(51) Int. Cl.
*H03K 17/06* (2006.01)
*G05F 1/618* (2006.01)
*G01R 31/26* (2014.01)
*G05F 1/46* (2006.01)
*H02J 1/00* (2006.01)
*H03K 17/10* (2006.01)

(52) U.S. Cl.
CPC .................. *H03K 17/102* (2013.01)

(58) Field of Classification Search
CPC ........ H03K 17/102; H03K 5/24; G01R 31/26; G05F 1/618; H04R 1/10; G11C 17/16
USPC ............. 327/108–112, 365/508; 326/22–27, 326/81–87
See application file for complete search history.

(56) References Cited

U.S. PATENT DOCUMENTS

| 9,160,328 | B2 | 10/2015 | Altunkilic et al. |
| 2010/0181882 | A1* | 7/2010 | Lee .......... E06B 5/006 312/326 |
| 2011/0025404 | A1* | 2/2011 | Cassia ............. H03K 17/08122 327/436 |
| 2013/0307576 | A1* | 11/2013 | Ilkov ................. G01R 31/2621 324/762.02 |
| 2014/0139268 | A1* | 5/2014 | Bayerer .............. H03K 17/063 327/109 |

FOREIGN PATENT DOCUMENTS

TW 201010305 A1 3/2010

* cited by examiner

*Primary Examiner* — Brandon S Cole
(74) *Attorney, Agent, or Firm* — CKC & Partners Co., Ltd.

(57) ABSTRACT

A voltage switching device includes a receiver, a voltage controlled switch, a voltage detector and a first switch circuit. The voltage controlled switch is connected between an input data terminal and the receiver. The first voltage generator circuit is configured to provide a first voltage. The voltage detector is configured to output a first logic signal while detecting the first voltage higher than a predetermined voltage. The first switch circuit is connected between the first voltage generator circuit and the voltage controlled switch, the first switch circuit is turned on according to the first logic signal, so that the voltage controlled switch is turned on by the first voltage, and data are transmitted from the input data terminal to the receiver.

14 Claims, 2 Drawing Sheets

VOLTAGE SWITCHING DEVICE AND METHOD

BACKGROUND

Field of Invention

The present invention relates to voltage switching devices and voltage switching methods.

Description of Related Art

A latch-up is a type of short circuit which can occur in an integrated circuit (IC). More specifically, it is the inadvertent creation of a low-impedance path between the power supply rails of a MOSFET circuit, triggering a parasitic structure which disrupts proper functioning of the part, possibly even leading to its destruction due to overcurrent.

In some approaches, a voltage generator provides a pumped voltage (e.g., VCCP), and a receiver uses the pumped voltage to turn on a gate of the MOSFET circuit. If the latch-up of the voltage generator happens, the pumped voltage will drop and the MOSFET circuit can't pass an input signal to the receiver. It makes product engineers difficult to debug and analysis.

SUMMARY

An embodiment of the present disclosure is related to a voltage switching device including a receiver, a voltage controlled switch, a voltage detector and a first switch circuit. The voltage controlled switch is connected between an input data terminal and the receiver. The first voltage generator circuit is configured to provide a first voltage. The voltage detector is configured to output a first logic signal while detecting the first voltage higher than a predetermined voltage. The first switch circuit is connected between the first voltage generator circuit and the voltage controlled switch, the first switch circuit is turned on according to the first logic signal, so that the voltage controlled switch is turned on by the first voltage, and data are transmitted from the input data terminal to the receiver.

Another embodiment of the present disclosure is related to a voltage switching device including a first voltage generator circuit, a first switch circuit, a second voltage generator circuit, a second switch circuit and a voltage detector. The first voltage generator circuit is configured to provide a first voltage. The first switch circuit is connected between the first voltage generator circuit and a voltage controlled switch, where the voltage controlled switch is connected between an input data terminal and a receiver. The second switch circuit is connected between the second voltage generator circuit and the voltage controlled switch. The voltage detector is configured to output a first logic signal to the first switch circuit and the second switch circuit while detecting the first voltage higher than a predetermined voltage, in which the first switch circuit is turned on and the second switch circuit is turned off according to the first logic signal, so that the voltage controlled switch is turned on by the first voltage, and data are transmitted from the input data terminal to the receiver.

Yet another embodiment of the present disclosure is related to a voltage switching method including steps of: detecting a first voltage outputted from a first voltage generator circuit, wherein a first switch circuit connected between the first voltage generator circuit and a voltage controlled switch, and the voltage controlled switch is connected between an input data terminal and the receiver; determining whether the first voltage is lower than a predetermined voltage; outputting a first logic signal to turn on the first switch circuit when the first voltage is higher than the predetermined voltage, so that the voltage controlled switch is turned on by the first voltage, and data are transmitted from the input data terminal to the receiver.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
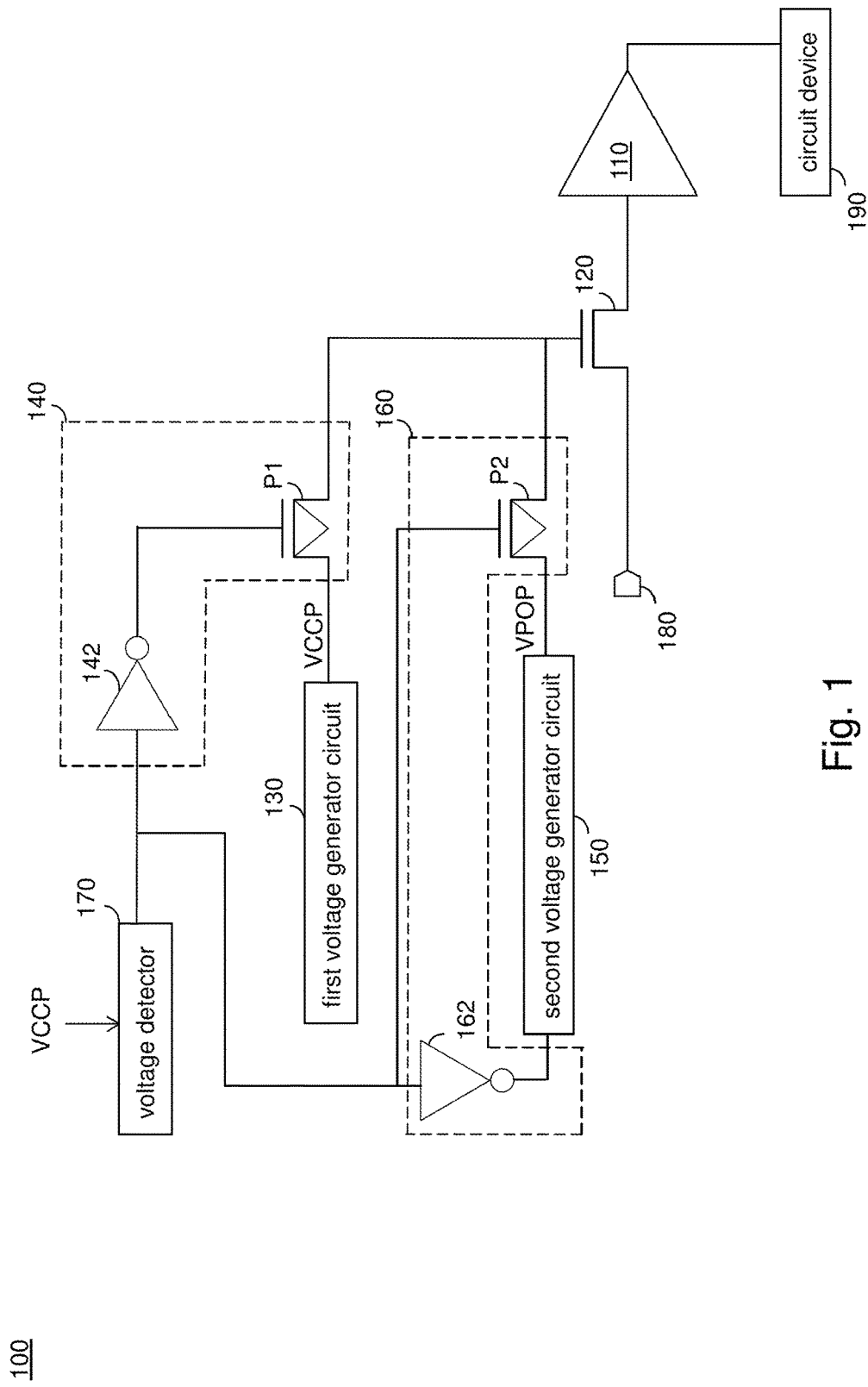
FIG. 1 is a block diagram of a voltage switching device according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a voltage switching device 100 according to some embodiments of the present disclosure. As shown in FIG. 1, the voltage switching device 100 includes a receiver 110, a voltage controlled switch 120, a first voltage generator circuit 130, a first switch circuit 140, a second voltage generator circuit 150, a second switch circuit 160 a voltage detector 170, and an input data terminal 180.

In structure, the first switch circuit 140 is connected between the first voltage generator circuit 130 and the voltage controlled switch 120, and the voltage controlled switch 120 is connected between the input data terminal 180 and the receiver 110. The second switch circuit 120 is connected between the second voltage generator circuit 150 and the voltage controlled switch 120. The receiver 110 is connected to a circuit device 190 (e.g., a DRAM circuit).

In use, the first voltage generator circuit 130 is configured to provide a first voltage VCCP. The voltage detector 170 detects the first voltage outputted from the first voltage generator circuit 130 and determines whether the first voltage VCCP is lower than a predetermined voltage. When the first voltage VCCP (e.g., 3.2 V) is higher than the predetermined voltage, it means that the first voltage generator circuit 130 operates in normal without latch-up. When the first voltage VCCP is lower than the predetermined voltage, it means that the latch-up of the first voltage generator circuit 130 occurs, and therefore the first voltage (e.g., 1.6 V) is dropped.

The voltage detector 170 is configured to output a first logic signal (e.g., a logic high level signal) to the first switch circuit 140 and the second switch circuit 160 while detecting the first voltage VCCP higher than a predetermined voltage, in which the first switch circuit 140 is turned on and the second switch circuit 150 is turned off according to the first logic signal, so that the voltage controlled switch 120 can be turned on by the first voltage VCCP, and data can be transmitted from the input data terminal 180 to the receiver 110.

Otherwise, the voltage detector 170 outputs a second logic signal (e.g., a logic low level signal) to the first switch circuit 140 and the second switch circuit 160 while detecting the first voltage VCCP lower than the predetermined voltage, in which the first switch circuit 140 is turned off and the second switch circuit 160 is turned on according to the second logic signal, so that the second voltage generator circuit 150 can be enabled to provide a second voltage VPOP (e.g., 3.2 V), the voltage controlled switch 120 can be turned on by the second voltage VPOP, and data can be transmitted from the input data terminal 180 to the receiver 110.

In FIG. 1, the first switch circuit 140 includes a first semiconductor switch P1 and a first inverter 142. In structure, the first semiconductor switch 140 is connected between the first voltage generator circuit 130 and the voltage controlled switch 120, and the first inverter 142 is connected between the voltage detector 170 and the first switch 140.

When the voltage detector 170 outputs the first logic signal, the first inverter 142 inverts the first logic signal into the second logic signal to turn on the first semiconductor switch 140, so that the first voltage generator circuit 130 outputs the first voltage VCCP to turn on the voltage controlled switch 120 through the first semiconductor switch P1.

In FIG. 1, the second switch circuit 160 includes a second semiconductor switch P2 and a second inverter 162. In structure, the second semiconductor switch P2 is connected between the second voltage generator circuit 150 and the voltage controlled switch 120, and the second inverter 162 is connected between the voltage detector 170 and the second voltage generator circuit 160.

When the voltage detector 170 outputs the second logic signal to the first inverter 142, the second inverter 162 and the second semiconductor switch P2, in which the first inverter 142 inverts the second logic signal into the first logic signal to turn off the first semiconductor switch P1, the second inverter 162 inverts the second logic signal into the first logic signal to enable the second voltage generator circuit 150, and the second semiconductor switch P2 is turned on by the second logic signal, so that the enabled first voltage generator circuit 150 outputs the second voltage VPOP to turn on the voltage controlled switch 120 through the second semiconductor switch P2.

In some embodiments, the first voltage generator circuit 130 is a VCCP pump to provide a pumped voltage as the first voltage VCCP, and the second voltage generator circuit 150 is a VPOP pump to provide a high voltage as the second voltage VPOP. The VPOP pump can be one part of a DRAM circuit. Generally, the high voltage used to program the anti-fuse is referred to as a programming voltage.

In some embodiments, the first semiconductor switch P1 is a PMOS transistor, in which the gate of the first semiconductor switch P1 is connected to the output end of the first inverter 142, the input end of the first inverter 142 is connected to the voltage detector 170, the source of the first semiconductor switch P1 is connected to the first voltage generator circuit 130, and the drain of the first semiconductor switch P1 is connected to the gate of the voltage controlled switch 120 (e.g., a NMOS transistor).

In some embodiments, the second semiconductor switch P2 is a PMOS transistor, in which the gate of the second semiconductor switch P2 is connected to the voltage detector 170, the source of the second semiconductor switch P2 is connected to the second voltage generator circuit 150, and the drain of the second semiconductor switch P2 is connected to the to the gate of the voltage controlled switch 120 (e.g., a NMOS transistor). The input end of the second inverter 162 is connected to the voltage detector 170, and the output end of the second inverter 162 is connected to the second voltage generator circuit 150. When receiving the second logic signal (e.g., the logic low level signal), the second voltage generator circuit 150 is not enabled. When receiving the first logic signal (e.g., the logic high level signal), the second voltage generator circuit 150 is enabled.

Figure 2:
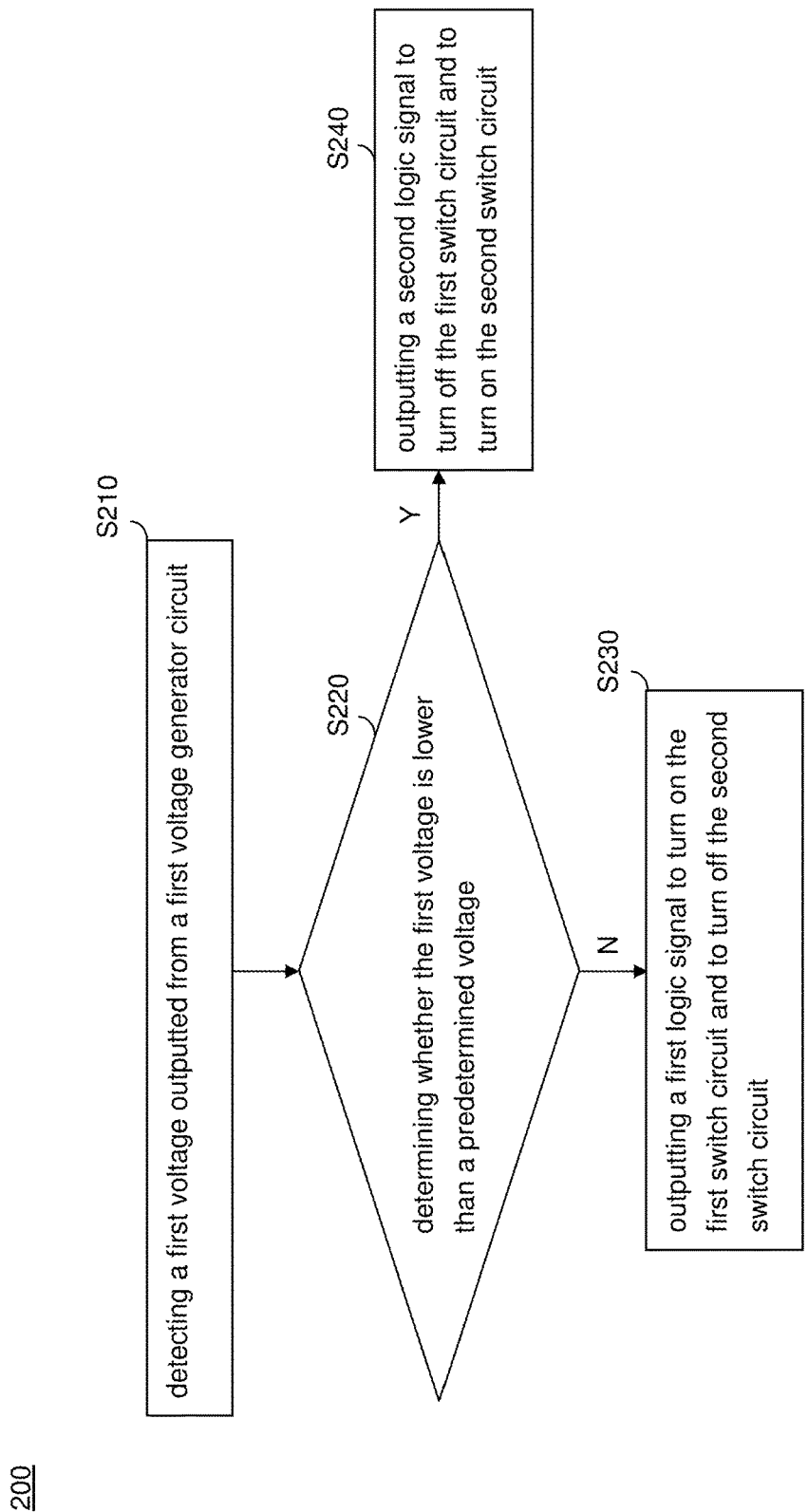
FIG. 2 is a flow chart of a voltage switching method according to some embodiments of the present disclosure.

For a more complete understanding of a voltage switching method performed by the voltage switching device 100, referring FIGS. 1-2, FIG. 2 is a flow chart of the voltage switching method 200 according to an embodiment of the present invention. As shown in FIG. 2, the voltage switching method 200 includes operations S210, S220, S230 and S240. However, as could be appreciated by persons having ordinary skill in the art, for the steps described in the present embodiment, the sequence in which these steps is performed, unless explicitly stated otherwise, can be altered depending on actual needs; in certain cases, all or some of these steps can be performed concurrently.

In operation S210, the first voltage VCCP outputted from the first voltage generator circuit 130 is detected. In operation S220, it is determined whether the first voltage VCCP is lower than the predetermined voltage. In operation S230, the first logic signal (e.g., the logic high level signal) is outputted to turn on the first switch circuit 140 when the first voltage is higher than the predetermined voltage, so that the voltage controlled switch 120 can be turned on by the first voltage VCCP, and data can be transmitted from the input data terminal 180 to the receiver 110.

In operation S240, the second logic signal (e.g., the logic low level signal) is outputted to turn off the first switch circuit 140 and to turn on the second switch circuit 160 when the first voltage VCCP is lower than the predetermined voltage, so that the second voltage generator circuit 150 can be enabled to provide a second voltage VPOP, the voltage controlled switch 120 can be turned on by the second voltage VPOP, and data can be transmitted from the input data terminal 180 to the receiver 110.

In the voltage switching method 200, the first inverter 142 is used for inverting the first logic signal into the second logic signal to turn on the first semiconductor switch P1, so that the first voltage generator circuit 130 outputs the first voltage VCCP to turned on the voltage controlled switch 120 through the first semiconductor switch P1.

Alternatively, the first inverter 142 is used for inverting the second logic signal into the first logic signal to turn off the first semiconductor switch P1, so that the first voltage generator circuit 130 is electrically isolated from the voltage controlled switch 120. Moreover, the second inverter 162 is used for inverting the second logic signal into the first logic signal to enable the second voltage generator circuit 150 and to turn on the second semiconductor switch P2, so that the enabled first voltage generator circuit 150 outputs the second voltage VPOP to turned on the voltage controlled switch 120 through the second semiconductor switch P2.

In view of the above, the voltage switching device 100 and the voltage switching method 200 make receiver 110 always get the correct data, no matter whether the latch-up of the first voltage generator circuit 130 occurs.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A voltage switching device, comprising:
 a receiver;
 a voltage controlled switch connected between an input data terminal and the receiver;
 a first voltage generator circuit configured to provide a first voltage;
 a voltage detector configured to output a first logic signal while detecting the first voltage higher than a predetermined voltage;
 a first switch circuit connected between the first voltage generator circuit and the voltage controlled switch, the first switch circuit being turned on according to the first logic signal, so that the voltage controlled switch is turned on by the first voltage, and data are transmitted from the input data terminal to the receiver;
 a second voltage generator circuit configured to provide a second voltage after the voltage detector outputs a second logic signal while detecting the first voltage dropped lower than the predetermined voltage; and
 a second switch circuit connected between the second voltage generator circuit and the voltage controlled switch, wherein the first switch circuit is turned off according to the second logic signal, and the second switch circuit is turned on according to the second logic signal, so that the voltage controlled switch is turned on by the second voltage, and the data are transmitted from the input data terminal to the receiver,
 wherein the first switch circuit comprises:
 a first semiconductor switch connected between the first voltage generator circuit and the voltage controlled switch; and
 a first inverter connected between the voltage detector and the first switch, wherein when the voltage detector outputs the first logic signal, the first inverter inverts the first logic signal into the second logic signal to turn on the first semiconductor switch, so that the first voltage generator circuit outputs the first voltage to turn on the voltage controlled switch through the first semiconductor switch.

2. The voltage switching device of claim 1, wherein the first logic signal is a logic high level signal, the second logic signal is a logic low level signal, and the first semiconductor switch is a PMOS transistor.

3. The voltage switching device of claim 1, wherein the second switch circuit comprises:
 a second semiconductor switch connected between the second voltage generator circuit and the voltage controlled switch; and
 a second inverter connected between the voltage detector and the second voltage generator circuit, wherein when the voltage detector outputs the second logic signal to the first inverter, the second inverter and the second semiconductor switch, wherein the first inverter inverts the second logic signal into the first logic signal to turn off the first semiconductor switch, the second inverter inverts the second logic signal into the first logic signal to enable the second voltage generator circuit, and the second semiconductor switch is turned on by the second logic signal, so that the enabled first voltage generator circuit outputs the second voltage to turn on the voltage controlled switch through the second semiconductor switch.

4. The voltage switching device of claim 3, wherein the first logic signal is a logic high level signal, the second logic signal is a logic low level signal, and the second semiconductor switch is a PMOS transistor.

5. The voltage switching device of claim 4, wherein the voltage controlled switch is a NMOS transistor.

6. A voltage switching device, comprising:
 a first voltage generator circuit configured to provide a first voltage;
 a first switch circuit connected between the first voltage generator circuit and a voltage controlled switch, wherein the voltage controlled switch is connected between an input data terminal and a receiver;
 a second voltage generator circuit;
 a second switch circuit connected between the second voltage generator circuit and the voltage controlled switch;
 a voltage detector configured to output a first logic signal to the first switch circuit and the second switch circuit while detecting the first voltage higher than a predetermined voltage, wherein the first switch circuit is turned on and the second switch circuit is turned off according to the first logic signal, so that the voltage controlled switch is turned on by the first voltage, and data are transmitted from the input data terminal to the receiver, wherein the voltage detector outputs a second logic signal to the first switch circuit and the second switch circuit while detecting the first voltage lower than the predetermined voltage, wherein the first switch circuit is turned off and the second switch circuit is turned on according to the second logic signal, so that the second voltage generator circuit is enabled to provide a second voltage, the voltage controlled switch is turned on by the second voltage, and data are transmitted from the input data terminal to the receiver,
 wherein the first switch circuit comprises:

a first semiconductor switch connected between the first voltage generator circuit and the voltage controlled switch; and a first inverter connected between the voltage detector and the first switch, wherein when the voltage detector outputs the first logic signal, the first inverter inverts the first logic signal into the second logic signal to turn on the first semiconductor switch, so that the first voltage generator circuit outputs the first voltage to turn on the voltage controlled switch through the first semiconductor switch.

7. The voltage switching device of claim 6, wherein the first logic signal is a logic high level signal, the second logic signal is a logic low level signal, and the first semiconductor switch is a PMOS transistor.

8. The voltage switching device of claim 6, wherein the second switch circuit comprises:

a second semiconductor switch connected between the second voltage generator circuit and the voltage controlled switch; and a second inverter connected between the voltage detector and the second voltage generator circuit, wherein when the voltage detector outputs the second logic signal to the first inverter, the second inverter and the second semiconductor switch, wherein the first inverter inverts the second logic signal into the first logic signal to turn off the first semiconductor switch, the second inverter inverts the second logic signal into the first logic signal to enable the second voltage generator circuit, and the second semiconductor switch is turned on by the second logic signal, so that the enabled first voltage generator circuit outputs the second voltage to turn on the voltage controlled switch through the second semiconductor switch.

9. The voltage switching device of claim 8, wherein the first logic signal is a logic high level signal, the second logic signal is a logic low level signal, and the second semiconductor switch is a PMOS transistor.

10. The voltage switching device of claim 9, wherein the voltage controlled switch is a NMOS transistor.

11. A voltage switching method, comprising:

detecting a first voltage outputted from a first voltage generator circuit, wherein a first switch circuit connected between the first voltage generator circuit and a voltage controlled switch, and the voltage controlled switch is connected between an input data terminal and the receiver;

determining whether the first voltage is lower than a predetermined voltage; and outputting a first logic signal to turn on the first switch circuit when the first voltage is higher than the predetermined voltage, so that the voltage controlled switch is turned on by the first voltage, and data are transmitted from the input data terminal to the receiver, wherein a second switch circuit is connected between a second voltage generator circuit and the voltage controlled switch, and the voltage switching method further comprising: outputting a second logic signal to turn off the first switch circuit and to turn on the second switch circuit when the first voltage is lower than the predetermined voltage, so that the second voltage generator circuit is enabled to provide a second voltage, the voltage controlled switch is turned on by the second voltage, and data are transmitted from the input data terminal to the receiver, wherein the first switch circuit comprises a first inverter and a first semiconductor switch connected between the first voltage generator circuit and the voltage controlled switch, and the voltage switching method further comprising: using the first inverter for inverting the first logic signal into the second logic signal to turn on the first semiconductor switch, so that the first voltage generator circuit outputs the first voltage to turn on the voltage controlled switch through the first semiconductor switch.

12. The voltage switching method of claim 11, further comprising:

using the first inverter for inverting the second logic signal into the first logic signal to turn off the first semiconductor switch, so that the first voltage generator circuit is electrically isolated from the voltage controlled switch.

13. The voltage switching method of claim 12, wherein the second switch circuit comprises a second inverter and a second semiconductor switch connected between the second voltage generator circuit and the voltage controlled switch, and the voltage switching method further comprising:

using the second inverter for inverting the second logic signal into the first logic signal to enable the second voltage generator circuit and to turn on the second semiconductor switch, so that the enabled first voltage generator circuit outputs the second voltage to turn on the voltage controlled switch through the second semiconductor switch.

14. The voltage switching device of claim 13, wherein the first logic signal is a logic high level signal, the second logic signal is a logic low level signal, the first semiconductor switch is a PMOS transistor, the second semiconductor switch is a PMOS transistor, and the voltage controlled switch is a NMOS transistor.

* * * * *